United States Patent [19]
Suzuki et al.

[11] Patent Number: 5,804,089
[45] Date of Patent: Sep. 8, 1998

[54] PLASMA PROCESSING APPARATUS AND METHOD

[75] Inventors: Masaki Suzuki, Hirakata; Shigeyuki Yamamoto, Nara, both of Japan

[73] Assignee: Matsushita Electric Industrial Co., Ltd., Osaka, Japan

[21] Appl. No.: 550,116

[22] Filed: Oct. 30, 1995

[30] Foreign Application Priority Data

Oct. 31, 1994 [JP] Japan .................................. 6-267189

[51] Int. Cl.⁶ .............................. C23F 1/02; C23C 14/50; C23C 16/00
[52] U.S. Cl. .............................. 216/71; 216/67; 156/345; 156/643.1; 204/298.07; 204/298.09; 204/298.15; 204/298.31; 204/298.33; 118/723 E; 118/724; 118/728; 427/248.1
[58] Field of Search ................................. 156/345, 643.1; 216/67, 71; 204/298.07, 298.08, 298.09, 298.15, 298.31, 298.33, 192.1, 192.12; 118/723 R, 723 E, 724, 725, 728; 427/248.1

[56] References Cited

U.S. PATENT DOCUMENTS

| 4,458,746 | 7/1984 | Holden et al. ........................... 118/724 |
| 4,724,222 | 2/1988 | Feldman ..................................... 269/21 |
| 4,931,135 | 6/1990 | Horiuchi et al. .......................... 216/67 |
| 5,203,958 | 4/1993 | Arai et al. ................................. 156/345 |
| 5,509,464 | 4/1996 | Turner et al. ............................. 118/728 |

FOREIGN PATENT DOCUMENTS

| 234 883 | 4/1986 | Germany ................................ 118/724 |
| 4-87330 | 3/1992 | Japan . |
| 5-29222 | 2/1993 | Japan . |

Primary Examiner—Nam Nguyen
Assistant Examiner—Rodney G. McDonald
Attorney, Agent, or Firm—Wenderoth, Lind & Ponack

[57] ABSTRACT

A plasma processing apparatus includes a vacuum container accommodating a to-be-processed substrate. A vacuum discharge device discharges gas from the container, and a gas feed device feeds a gas in the container. A pair of electrodes includes one which has a concave surface for holding the substrate thereon. A high frequency power supply device supplies a high frequency power to the electrodes, a gas feed device for filling between the substrate and the electrodes with an inert gas to cool the substrate, and a holding device for pressing a side end face of the substrate in a direction along a surface of the substrate to shape the substrate into a concave while holding the substrate on the concave surface of the electrode.

18 Claims, 4 Drawing Sheets

PLASMA PROCESSING APPARATUS AND METHOD

BACKGROUND OF THE INVENTION

The present invention relates to a plasma processing apparatus and method used in manufacturing semiconductors or liquid crystal display elements (LCDs), e.g., a dry etching apparatus, a sputtering apparatus, a CVD apparatus, etc.

Recently, He or another inert gas is often filled between a rear surface of a silicon substrate and an electrode so as to cool the substrate when subjected to dry etching in a manufacturing process of semiconductors.

A conventional dry etching apparatus will be described with reference to FIG. 5. In FIG. 5, there are provided a vacuum container 1 and a vacuum pump 2. An upper electrode 3 of the apparatus has gas outlets at a lower surface thereof is and grounded at 5 via a gas inlet 4 at an upper part thereof. A lower electrode 7, which has a little less than 1 mm convex spherical surface per 150 mm diameter, is placed on an insulating plate 8 and connected to a capacitor 10 and a high frequency power source 11 through a terminal 9. A hole 12 at a center of the electrode 7 is connected by a pipe 13 to an external feed device 113 for feeding low pressure He. A seal 14 is arranged in the periphery of the electrode 7. Shallow cavities 15 communicating with the center hole 12 are distributed over an upper surface of the electrode 7. Cooling water circulates in a cooling water path 16 inside the electrode 7. Supporting rods 18 support a clamp ring 17 in the upper periphery of the electrode 7. The supporting rods 18 are vacuum-sealed by bellows 19 and moved up and down by a lift device A (not shown) outside the apparatus.

The dry etching apparatus having the above-described constitution is driven in a manner as follows.

In the first place, a silicon wafer 6 is put on the lower electrode 7 and the clamp ring 17 is lowered to press the silicon wafer 6 along the convex spherical surface of the lower electrode 7. Next, air in the vacuum container 1 is discharged by the vacuum pump 2, while a minute amount of etching gas is introduced through the gas inlet 4 by a gas feed device 104. At this time, a high frequency is applied from the high frequency power source 11 to thereby produce a plasma between the lower electrode 7 and upper electrode 3. The silicon wafer 6 is etched by the plasma. During this time, He gas of approximately 0.5 Pa, supplied through the pipe 13 by the gas feed device 113, is jetted out from the center hole 12 to thereby fill the cavities 15 on the upper surface of the lower electrode 7. The He gas in the cavities 15 removes much heat from the silicon wafer 6, and transmits the heat to the lower electrode 7 cooled by the cooling water because of its good fluidity. Accordingly, overheating of the silicon wafer 6 by the heat of the plasma and alteration of the resist on the wafer in quality, that is, deterioration to cause inferior etching is prevented. The He gas maintains the silicon wafer 6 at a constant temperature, and controls the etching conditions.

However, if the prior art is applied to a glass substrate for LCD, for instance a 370 mm×470 mm×1.1 mm rectangular glass substrate, it is considerably difficult from a structural viewpoint to press four sides of the substrate along the convex spherical surface of the lower electrode and moreover, a large tensile stress is impressed on the glass substrate to finally break the substrate. Meanwhile, if a method is employed to press only two of the four sides, specifically the 470 mm sides from above along the convex cylindrical surface which facilitates the pressing, the glass is bent by internal pressure and therefore the convex surface should be shaped to project 20 mm or more even when 0.5 Pa He is used. Uniform etching is hardly secured. The glass substrate is more easily bent if it is thin. As such, the method of pressing the periphery of a large square glass substrate to the convex surface is not practicable.

For the above reason, conventionally, He gas is forbidden for cooling large glass substrates for LCD when dry etching. Since a large RF power cannot be impressed, processing time is rendered lengthy and the throughput of the apparatus is low.

SUMMARY OF THE INVENTION

The object of the present invention is therefore to provide a plasma processing apparatus and method allowing the application of He gas or another inert gas to cool large LCD substrates, with a high throughput and good temperature control efficiency, at an etching process or the like.

In accomplishing these and other objects, according to one aspect of the present invention, there is provided a plasma processing apparatus comprising:

a vacuum container accommodating a substrate that is to be processed (hereinafter referred to as a to-be-processed substrate);

a vacuum discharge device for discharging a gas in the container;

a gas feed device for feeding a gas in the container;

a pair of electrodes, one of which has a concave surface for holding the substrate thereon;

a high frequency power supply device for supplying high frequency power to the electrodes;

a gas feed device for filling an inter gas between the substrate and the electrodes to cool the substrate; and a holding device for pressing a side end face of the substrate in a direction along a surface of the substrate to shape the substrate into a concave while holding the substrate on the concave surface of the electrode.

According to another aspect of the present invention, there is provided a plasma processing method which is carried out in a plasma processing apparatus comprising:

a vacuum container accommodating a to-be-processed substrate;

a vacuum discharge device for discharging a gas in the container;

a gas feed device for feeding a gas in the container;

a pair of electrodes one of which has a concave surface for holding the substrate thereon;

a high frequency power supply device for supplying a high frequency power to the electrodes; and a gas feed device for filling an inter gas between the substrate and the electrodes, the method comprising the steps of:

placing the substrate on the concave surface of the electrode; and pressing a side end face of the substrate in a direction along a surface of the substrate to shape the substrate into a concave while holding the substrate on the concave surface of the electrode.

BRIEF DESCRIPTION OF THE DRAWINGS

These and other objects and features of the present invention will become clear from the following description taken in, conjunction with the preferred embodiments thereof and with reference to the accompanying drawings, in which.

DETAILED DESCRIPTION OF THE PREFERRED EMBODIMENTS

Figure 1:
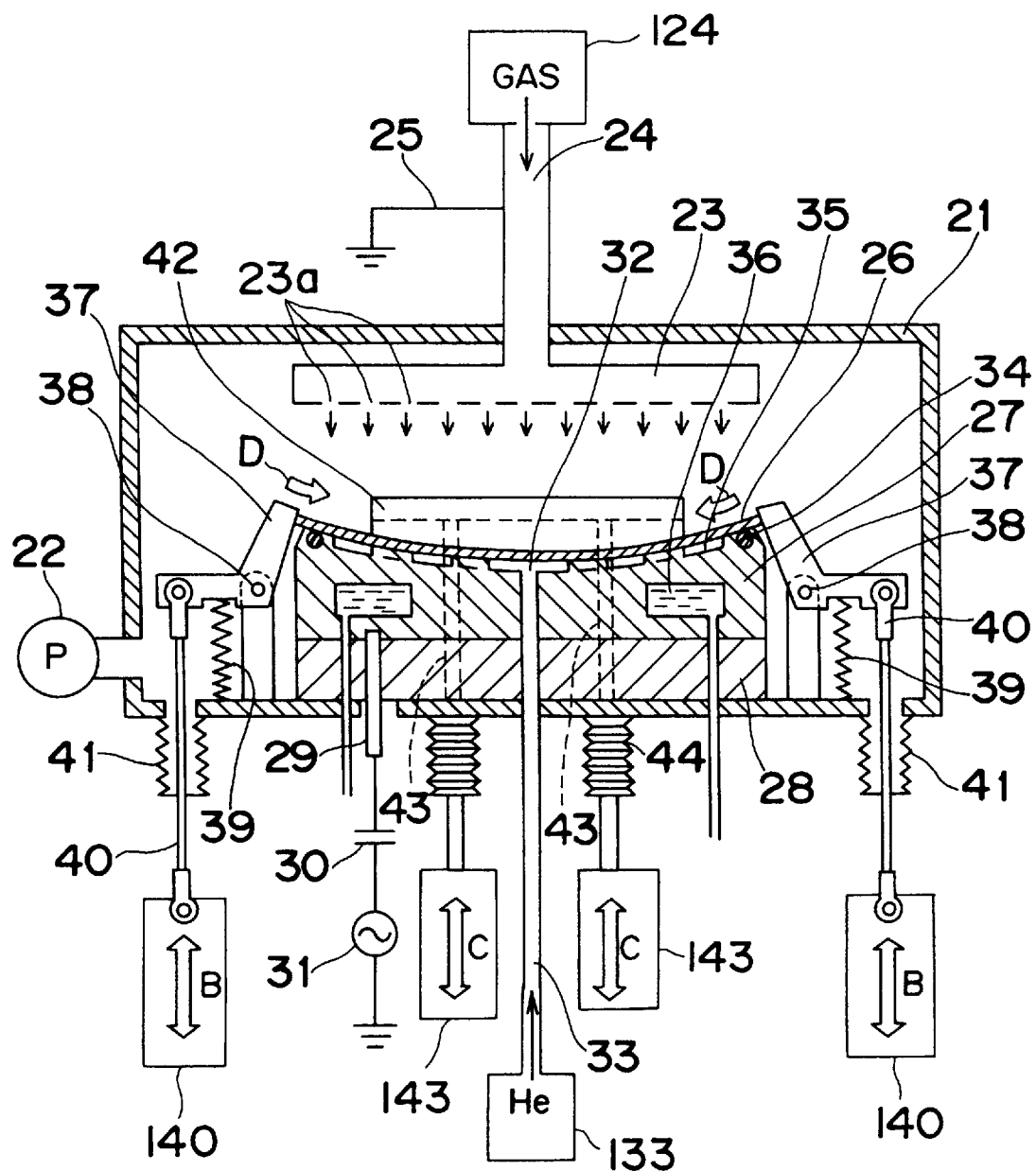
FIG. 1 is a longitudinal sectional view of a plasma processing apparatus according to one embodiment of the present invention.

Before the description of the present invention proceeds, it is to be noted that like parts are designated by like reference numerals throughout the accompanying drawings.

Preferred embodiments of the present invention will be discussed hereinbelow with reference to the drawings.

Figure 2:
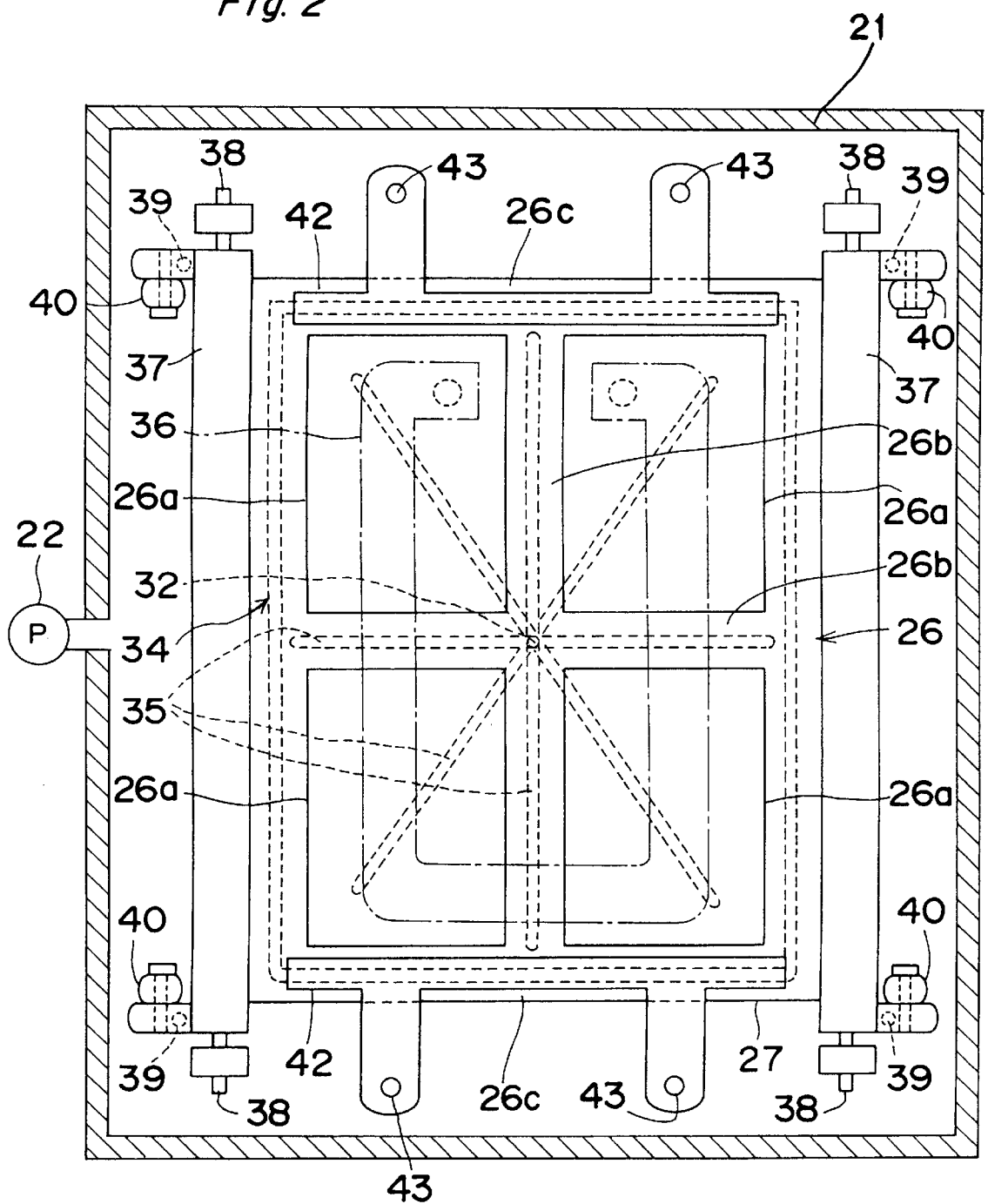
FIG. 2 is a plan view of a part of the plasma processing apparatus of FIG. 1.

In a plasma processing apparatus of one embodiment of the present invention shown in FIGS. 1 and 2, there are provided a vacuum container 21 and a vacuum pump 22. An upper electrode 23 has gas jet ports 23a at a lower surface thereof and a gas feed port 24 connected to a gas feed device 124 at an upper part, which is grounded at 25. A glass substrate 26 for LCD (e.g. 370 mm×470 mm×1.1 mm) is to be processed by the apparatus. A lower electrode 27 has an upper surface thereof shaped into a concave cylindrical surface with a 10 mm recess as one example for the above glass substrate 26 (FIG. 1 shows a cross section of a shorter side of the lower electrode 27). The electrode 27 insulated by an insulating plate 28 is connected to a capacitor 30 and a high frequency power source 31 through a terminal 29. A hole 32 formed at a center of the electrode 27 is connected to a gas feed drive 133 for feeding low pressure He through a pipe 33. On the upper cylindrical concave surface of the electrode 27 there are distributed grooves and shallow cavities 35, of 0.1 mm or smaller depth as one example, both communicating with the central hole 32. Cooling water circulates in a cooling water path 36 inside the electrode 27, and a seal 34 is in the periphery thereof. Two V-shaped levers 37 form a pressing element. Each is made of an insulating material to press the longer side end portion of the glass substrate 26 and are arranged in the vicinity of the each of two longer sides of the electrode 27 so as to be able to swing about fulcrums 38. Pressure springs 39 and driving links 40 are connected to the lever 37. The driving links 40, with a lower end sealed by bellows 41, are moved up and down in a direction B by a vertical driving device 140, such as a pneumatic cylinder or a hydraulic cylinder, from under the vacuum container 21. The springs 39 always apply their forces to the side end faces of the substrate 26 via the levers 37 to press the side end faces thereof. The driving device 140 drives the levers 37 against the forces of the springs 39 for removal of. Two shaping and pressing elements 42, each formed of an insulating material, are placed above the two shorter sides of the electrode 27. Each lower surface of the element is shaped into a convex shape in conformity with the concave cylindrical upper surface of the electrode 27 (e.g. an approximately 1720 mm radius). The pressing elements 42 are driven in directions C by driving devices 143, such as pneumatic cylinders, or hydraulic cylinders via two respective two supporting rods 43 and bellows 44 under the vacuum container 21.

The dry etching apparatus having the above constitution operates in a manner which will be described with reference to FIGS. 1 and 2.

After the glass substrate 26 for LCD is set on the concave electrode 27, the supporting rods 43, each at a high level, are lowered to thereby hold the glass substrate 26 from above the shorter sides by the two pressing elements 42. The glass substrate 26 is shaped into a concave. Subsequently, the four driving links 40, each at a low level, are returned upward, so that the longer sides of the glass substrate 26 are toward each other in a direction D parallel to a surface of the substrate 26 with the levers 37 through the force of the springs 39. The compression forces of the springs 39 press the glass substrate 26 to the cylindrical surface of the concave electrode 27. A pressing force of each lever 37 to press the longer side at this time is calculated as a stress of the thin-walled cylinder receiving an external pressure. In other words, for example, approximately 54 kgf or more pressing force is required for 0.5 Pa He.

Thereafter, the air inside the vacuum container 21 is discharged by the vacuum pump 22. While a minute amount of etching gas is Introduced through the gas feed port 24, a plasma is formed between the lower electrode 27 and the upper electrode 23 by a high frequency impressed from the high frequency power source 31, thereby etching the glass substrate 26. Since 0.5 Pa He gas is supplied through the pipe 33 during this time, the He gas is jetted out from the central hole 32 and filled in the grooves and cavities 35 on the upper surface of the electrode 27. The He gas takes heat away from the glass substrate 26 and transmits the heat to the electrode 27 cooled by the cooling water owing to a good fluidity. The glass substrate 26 is, consequently, effectively cooled. At the same time, the glass substrate 26 is maintained at a constant temperature during the process.

The two driving links 40 are lowered when the etching is completed. The levers 37 are detached sideways. Then, the supporting rods 43 are moved up until the shaping and pressing elements 42 are separated from the surface of the substrate 26 in order to take out the glass substrate 26. The pressing elements 42 may be eliminated if the glass substrate 26 is so large that a central part of the substrate 26, supported at both ends, droops to a large degree.

Regarding buckling deformation that is feared to take place when an external pressure is impressed on the thin cylinder, the glass substrate 26 generally shows no buckling, because the glass substrate 26 is a very small part of the cylinder.

Figure 5:
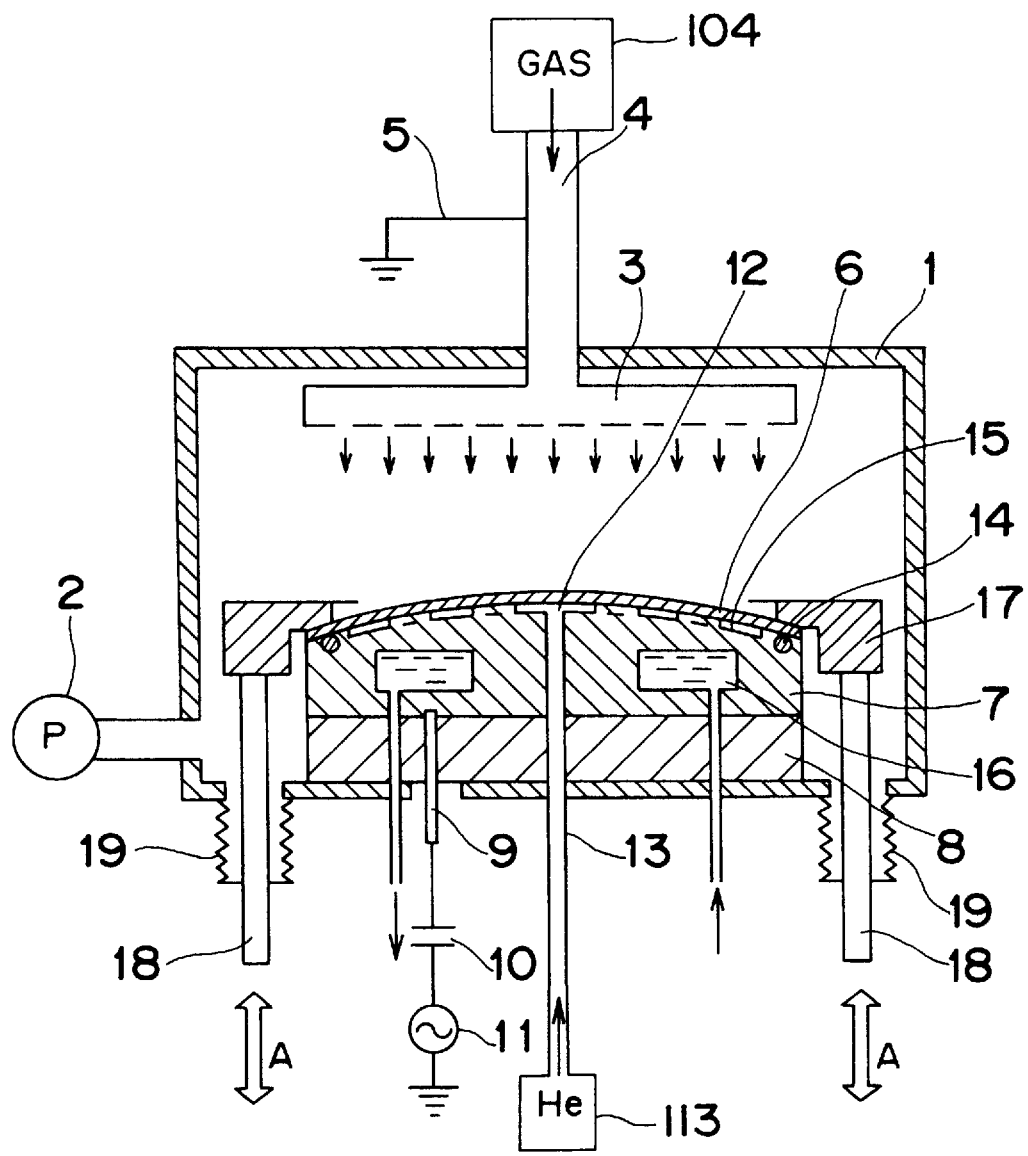
FIG. 5 is a longitudinal sectional view of a conventional plasma processing apparatus.

The gas feed device 104 and the external gas feed device 113 in FIG. 5 correspond to the gas feed device 124 and the gas feed device 133, respectively. The cavities 35 in FIG. 1 are exaggeratedly enlarged for easy understanding in the sectional figure.

In the embodiment, when the driving devices 140 are not provided in the apparatus, the levers 37 are manually driven via the links 40.

In the embodiment, the portions where the shaping and pressing elements 42 press the substrate 26 are shown by 26c in FIG. 2. For example, in a large substrate the shaping and pressing element 42 may be pressed at crossed portions 26b of the middle of the substrate, which are elongated in parallel to the longer side and the shorter side of the substrate when the crossed portions 26b are separated from four or more portions of rectangular area 26a where circuits, etc., are formed.

Figure 3:
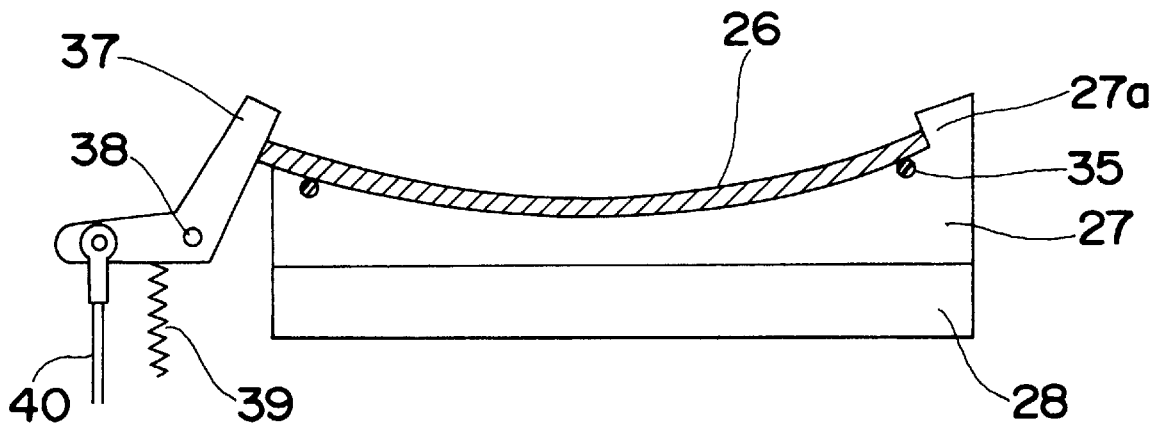
FIG. 3 is a schematically longitudinal sectional view of a part of a plasma processing apparatus according to another embodiment of the present invention.

In a modification of the embodiment, as shown in FIG. 3, one longer side end of the substrate 26 is brought in contact with a projection 27a provided on one side of the surface of the lower electrode 27 and the other longer side end of the substrate 26 is supported and pressed by the lever 37.

Figure 4:
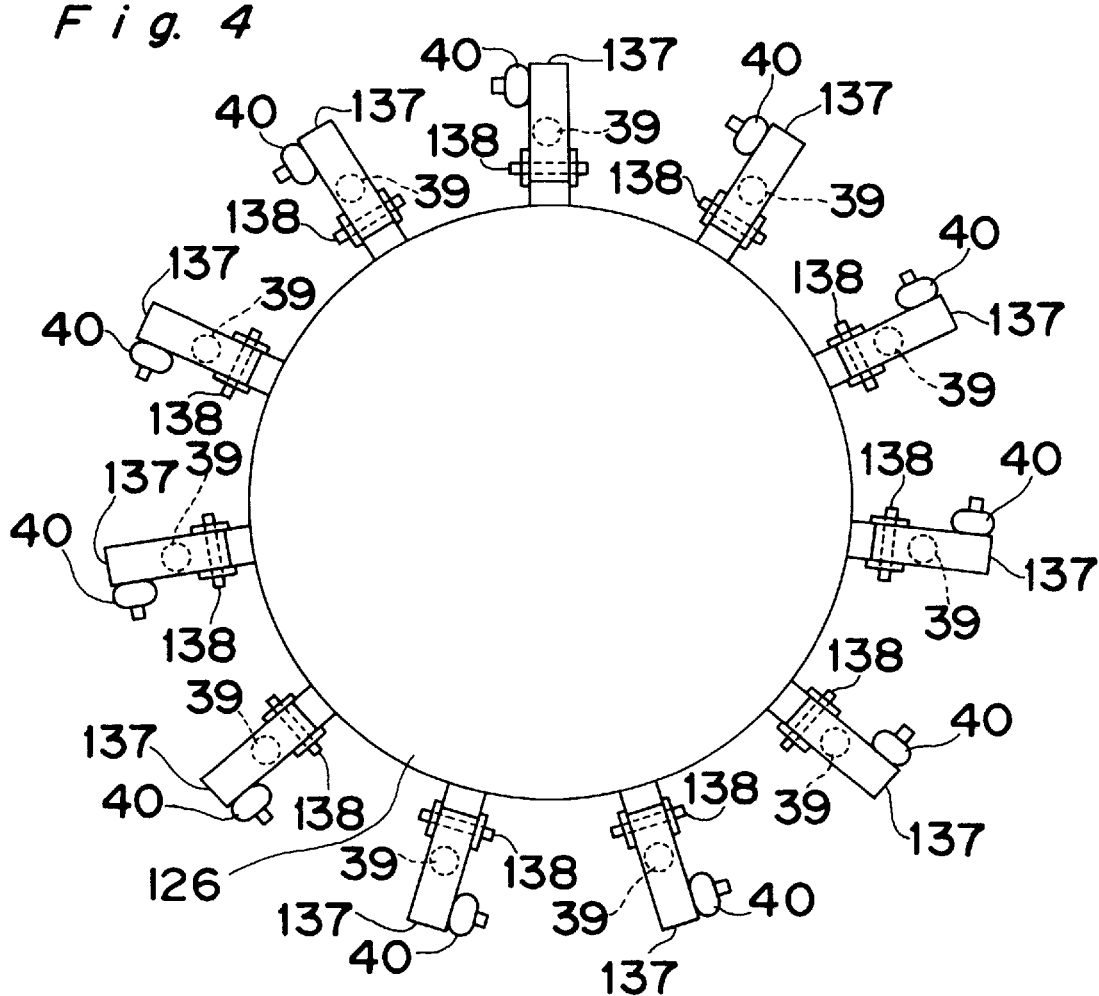
FIG. 4 is a plan view of a part of a plasma processing apparatus according to a further embodiment of the present invention.

The shape of the substrate is not limited to a rectangle, but may be circular, such as a semiconductor wafer. A plasma processing apparatus and method according to another embodiment of the present invention is shown in FIG. 4 to apply to such a circular substrate. The levers 137 and fulcrums 138 correspond to the levers 37 and the fulcrums 38, respectively. The levers 137 press the curved side surface of a circular substrate 126 at their end surfaces. The end surface of the lever 137 is preferably shaped in a curved surface in conformity with the curved surface of the substrate 126.

In the embodiments, the substrate is shaped in a concave in a degree to which the substrate is not broken or damaged. In order to improve the cooling efficiency, it is preferable that a substrate is shaped in a concave as deeply as possible to resist the He pressure.

The embodiments are not limited to the case where the whole side end faces of the substrate may be pressed by the pressing surfaces of the levers 37 as shown in FIGS. 1 and 2, but each side end face of the substrate may be partially pressed by the pressing surfaces of the levers as shown in FIG. 4.

The apparatus is applicable not only to a dry etching apparatus, but also to a sputtering apparatus and a CVD apparatus so as to cool substrates and, moreover, heat substrates because of good thermal conductivity.

As is described hereinabove, the plasma processing apparatus according to the present invention is provided with a vacuum container, a vacuum discharge device, a reaction gas feed device, at least a pair of electrodes, a feed device for feeding high frequency power to the electrodes, and a gas feed device for filling an inert gas between a to-be-processed substrate and the electrodes. The electrode receiving the substrate thereon is concave. The apparatus is further provided with pressing elements for pressing side end faces of the substrate along a surface of the substrate and also shaping and pressing elements for assisting the shaping of the surface of the substrate into a concave by pressing the substrate against the concave surface of the lower electrode. Accordingly, the to-be-processed substrate is fully cooled even during plasma processing, and a high RF power is applied. The plasma processing apparatus shows a good etching performance with a large throughput and a good temperature stability.

According to one aspect of the present invention, the plasma processing apparatus has a concave electrode which holds the to-be-processed substrate thereon and to which an inert gas such as He is supplied, the holding device pressing side end faces of the substrate along the surface of the substrate. Additionally, the apparatus may have the holding devices include the pressing elements for pressing side end faces of the substrate along the surface of the substrate and/or the shaping and pressing elements for helping to shape the surface of the substrate into a concave by pressing the substrate against the concave surface of the electrode.

In the above constitution, for example, two sides of a large rectangular glass substrate are pressed onto the cylindrical concave electrode by the holding device from above, whereby the glass substrate is shaped into a cylindrical concave shape. Thereafter, end faces of the remaining two sides of the rectangular glass substrate are pressed along a surface of the substrate by the holding device. He gas is filled in the shallow cavities between a rear surface of the glass substrate and the surface of the concave electrode, thereby pressing the glass from outside of the glass. Since the glass is resistive to compression, the end faces of the glass substrate are allowed to be pressed intensively, and therefore are prevented from being separated from the surface of the electrode by the pressure of the He gas. Thus, the glass substrate is fully cooled. For example, a large RF power may be accordingly impressed for etching, thus realizing a dry etching apparatus showing a high throughput. In addition, the temperature during etching is stabilized.

According to one aspect of the method of the present invention, even though a large LCD is used as a substrate, the LCD may be sufficiently cooled by the inert gas such as He gas during the etching process with a high throughput and good temperature control efficiency.

Although the present invention has been fully described in connection with the preferred embodiments thereof and with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A plasma processing apparatus, comprising:
   a vacuum container accommodating a rectangular substrate that is to be processed;
   a vacuum discharge device for discharging gas from the container;
   a gas feed device for feeding a gas in to the container;
   a pair of electrodes, one of said pair of electrodes having a concave surface for holding the rectangular substrate thereon;
   a high frequency power supply device for supplying high frequency power to said electrodes;
   a second gas feed device for feeding an inert gas between the rectangular substrate and the one of said pair of electrodes for cooling the rectangular substrate; and
   a holding means comprising a shaping and pressing element for pressing the surface of the rectangular substrate against said concave surface of the one of said pair of electrodes so as to shape the surface of the rectangular substrate into a concave, said holding means being further for pressing a side end face of the rectangular substrate in a direction along a surface of the rectangular substrate so as to shape the rectangular substrate into a concave shape and hold the rectangular substrate on said concave surface of the one of said pair of electrodes.

2. The plasma processing apparatus of claim 1, wherein:
   the one of said pair of electrodes comprises a projection adjacent to said concave surface thereof; and
   one of two confronting sides of the rectangular substrate engages said projection and the other of the two confronting sides is pressed on its side end face by said holding means.

3. The plasma processing apparatus of claim 2, wherein said concave surface of the one of said pair of electrodes is a cylindrical concave surface.

4. The plasma processing apparatus of claim 1, wherein said concave surface of the one of said pair of electrodes is a cylindrical concave surface.

5. The plasma processing apparatus of claim 4, wherein the rectangular substrate comprises longer sides and said holding means comprises pressing elements arranged at the longer sides of the rectangular substrate for pressing the longer side end faces of the rectangular substrate in the direction along the surface of the rectangular substrate so as to shape the rectangular substrate into a concave while holding the rectangular substrate on said concave surface of the one of said pair of electrodes.

6. The plasma processing apparatus of claim 1, wherein the rectangular substrate comprises longer sides and said holding means comprises pressing elements arranged at the longer sides of the rectangular substrate for pressing the longer side end faces of the rectangular substrate in the direction along the surface of the rectangular substrate so as to shape the rectangular substrate into a concave and hold the rectangular substrate on said concave surface of the one of said pair of electrodes.

7. The plasma processing apparatus of claim 6, wherein said shaping and pressing element of said holding means comprises two shaping pressing elements located at shorter sides of the rectangular substrate for pressing the surface of the rectangular substrate at the shorter sides against said concave surface of the one of said pair of electrodes so as to shape the surface of the rectangular substrate into a concave.

8. The plasma processing apparatus of claim 1, wherein said holding means comprises levers pivoted on respective fulcrums for engaging the side end faces of the rectangular substrate, springs connected with said levers biasing said levers into engagement with the side end faces of the rectangular substrate and a driving device connected with said levers for driving said levers to disengage from the side end faces of the rectangular substrate for removal of the rectangular substrate from the one of said pair of electrodes.

9. A method of plasma processing carried out with a plasma processing apparatus that comprises a vacuum container accommodating a rectangular substrate that is to be processed, a vacuum discharge device for discharging gas from the container, a gas feed device for feeding a gas in to the container, a pair of electrodes, one of said pair of electrodes having a concave surface for holding the rectangular substrate thereon, a high frequency power supply device for supplying high frequency power to the electrodes, and a second gas feed device for feeding an inert gas between the rectangular substrate and the one of the pair of electrodes for cooling the rectangular substrate, said method comprising the steps of:

placing the substrate on the concave surface of the one of the electrodes;

pressing the surface of the rectangular substrate with a shaping and pressing element so as to press the rectangular substrate against the concave surface of the one of the pair of electrodes so as to shape the surface of the rectangular substrate into a concave; and pressing a side end face of the rectangular substrate in a direction along the surface of the rectangular substrate so as to shape the rectangular substrate into a concave and hold the rectangular substrate on the concave surface of the one of the pair of electrodes;

cooling the rectangular substrate with inert gas from the second gas feed device.

10. The method of claim 9, wherein the one of the pair of electrodes comprises a projection adjacent to the concave surface thereof, and wherein said step of pressing a side end face comprises engaging one of two confronting sides of the rectangular substrate with the projection, the other of the two confronting sides being pressed on its side end face toward the projection.

11. The method of claim 10, wherein the concave surface of the one of the pair of electrodes is a cylindrical concave surface.

12. The method of claim 10, wherein in said step of pressing a side end face, a longer side end face of the rectangular substrate is pressed in the direction along the surface of the rectangular substrate so as to shape the substrate into a concave and hold the substrate on the concave surface of the one of the pair of electrodes.

13. The method of claim 9, wherein the concave surface of the one of the pair of electrodes is a cylindrical concave surface.

14. The method of claim 9, wherein in said step of pressing a side end face, a longer side end face of the rectangular substrate is pressed in the direction along the surface of the rectangular substrate so as to shape the substrate into a concave and hold the substrate on the concave surface of the one of the pair of electrodes.

15. The method of claim 9, wherein in said step of pressing the surface, the rectangular substrate is pressed at a shorter side of the rectangular substrate against the concave surface of the electrode so as to shape the surface of the rectangular substrate into a concave.

16. The method of claim 9, wherein said step of pressing comprises:

bringing levers, pivoted on respective fulcrums, into contact with the side end faces of the rectangular substrate; and biasing the levers into pressing contact with the side end faces with springs connected with the levers.

17. The method of claim 16, and further comprising a step of removing the rectangular substrate from the concave of the one of the pair of electrodes by driving the levers against the force of the springs with a driving device.

18. A plasma processing apparatus, comprising:

a vacuum container for accommodating a rectangular substrate that is to be processed;

a vacuum discharge device connected with the interior of said vacuum container;

a first gas feed device connected with the interior of said container;

a pair of electrodes, one of said pair of electrodes having a rectangular concave surface for holding the rectangular substrate thereon, said rectangular concave surface comprising two curved sides and two linear sides;

a high frequency power supply connected with said electrodes;

an inert cooling gas supply having an inert cooling gas feed line connected with the concave surface of the one of said pair of electrodes; and a holding mechanism positioned adjacent to the one of said pair of electrodes, said holding mechanism comprising a shaping and pressing element positioned along at least one of said curved sides of said rectangular concave surface, said shaping and pressing element being movably mounted for movement toward and away from said rectangular concave surface, and at least one member mounted in said container for movement between a substrate removal position and a pressing position in which said at least one member presses a side end face of the rectangular substrate in a direction along a surface of the rectangular substrate so as to shape the rectangular substrate into a concave shape and hold the rectangular substrate on said concave surface of the one of said pair of electrodes.

* * * * *